United States Patent [19]
Zelenka et al.

[11] Patent Number: 5,313,482
[45] Date of Patent: May 17, 1994

[54] METHOD AND CIRCUIT ARRANGEMENT FOR CORRECTING THE LIGHT POWER OUTPUT OF A LASER DIODE

[75] Inventors: Thomas Zelenka, Moenkeberg; Thomas Jacobsen, Kiel; Dietrich Asbach, Klausdorf, all of Fed. Rep. of Germany

[73] Assignee: Linotype-Hell AG, Fed. Rep. of Germany

[21] Appl. No.: 975,538

[22] PCT Filed: Aug. 10, 1991

[86] PCT No.: PCT/DE91/00641
§ 371 Date: Mar. 5, 1993
§ 102(e) Date: Mar. 5, 1993

[87] PCT Pub. No.: WO92/03861
PCT Pub. Date: Mar. 5, 1992

[30] Foreign Application Priority Data

Aug. 11, 1990 [DE] Fed. Rep. of Germany ....... 4025497

[51] Int. Cl.$^5$ ............................................. H01S 3/00
[52] U.S. Cl. ..................................... 372/38; 372/26; 372/29; 372/32
[58] Field of Search ................... 372/38, 26, 29, 32

[56] References Cited

U.S. PATENT DOCUMENTS

| | | | |
|---|---|---|---|
| 4,149,071 | 4/1979 | Nagai et al. ......................... | 250/199 |
| 4,716,315 | 12/1987 | Bell ..................................... | 307/491 |
| 4,733,398 | 3/1988 | Shibagaki et al. .................... | 372/31 |
| 4,754,460 | 6/1988 | Kimura et al. ....................... | 372/38 |
| 4,766,597 | 8/1988 | Olshansky ............................ | 372/44 |
| 4,835,780 | 5/1989 | Sugimura et al. .................... | 372/29 |
| 4,888,777 | 12/1989 | Takeyama ............................ | 372/38 |

FOREIGN PATENT DOCUMENTS

| | | |
|---|---|---|
| 0141192 | 5/1985 | European Pat. Off. ........ H04B 9/00 |
| 0319852A2 | 12/1988 | European Pat. Off. ....... H01S 3/103 |
| 0311279A1 | 4/1989 | European Pat. Off. ....... H01S 3/133 |
| 3603548A1 | 10/1986 | Fed. Rep. of Germany .......... H01S 3/133 |
| 3744334A1 | 7/1988 | Fed. Rep. of Germany ......... G06K 15/12 |

OTHER PUBLICATIONS

Patent Abstracts of Japan, vol. 13, No. 184, Apr. 28, 1989, "Drive Circuit of Semiconductor Laser", Nobuyuki Hirakata.

Patent Abstracts of Japan, vol. 14, No. 239, May 21, 1990, "Drive Circuit of Semiconductor Laser", Chitaka Konishi.

Patent Abstracts of Japan, vol. 9, No. 202, Aug. 20, 1985, Shiyouichi Itou, "Driving System for Laser Diode".

*Primary Examiner*—Georgia Y. Epps
*Attorney, Agent, or Firm*—Hill, Steadman & Simpson

[57] ABSTRACT

The invention concerns a process and circuit for correcting the light-power output of a laser diode. The circuit comprises a generator (2) for generating a driver current ($I_T$) which determines the light-power output of the laser diode. The driver current ($I_T$) is modulated by a modulation signal (B). To correct the light-power output, the circuit includes a linear low-pass filter (5) which is acted on by the modulation signal (B) and which approximately simulates the change with time of the internal temperature of the laser diode (1) as a function of the modulation signal (B). The output signal of the linear low-pass filter (5) acts as a driver current ($I_T$) correction signal (K), thus compensating for the temperature dependence of the laser-diode light-power output.

13 Claims, 4 Drawing Sheets

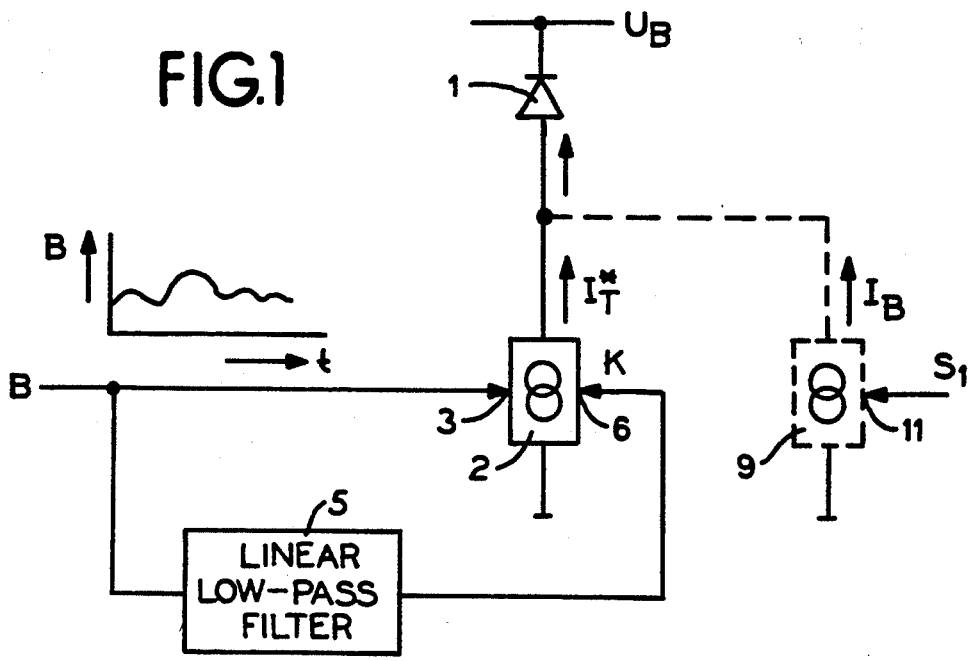
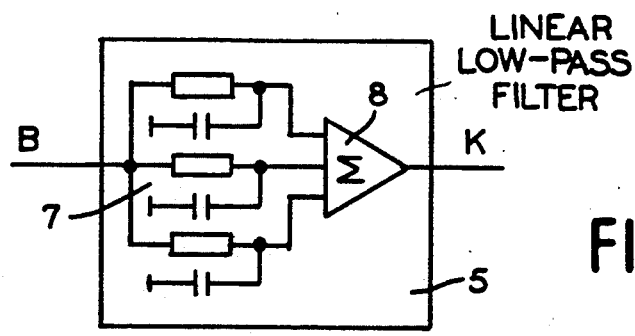
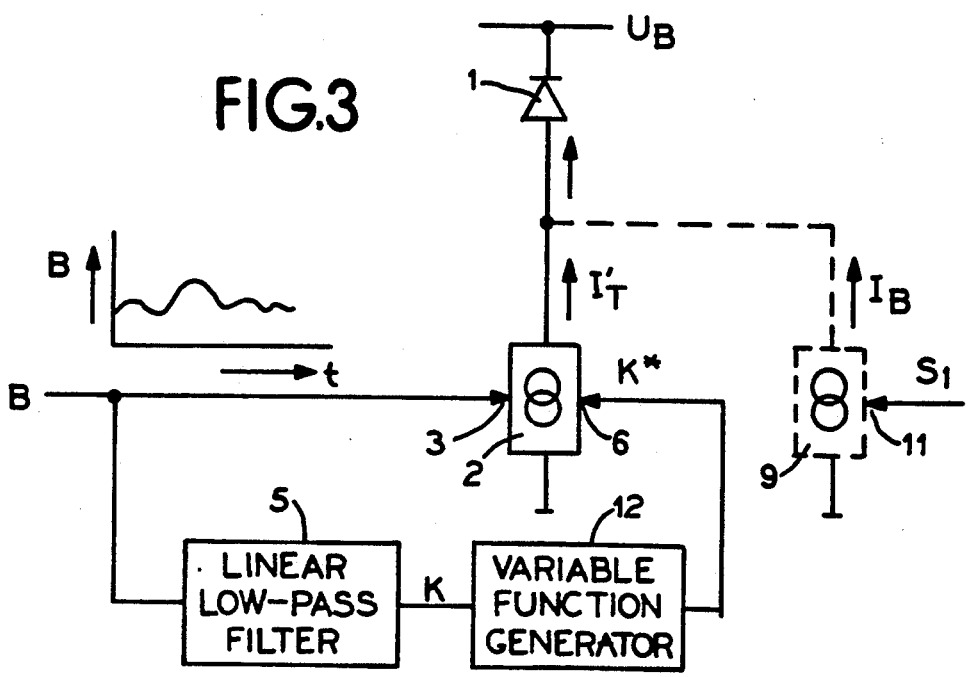

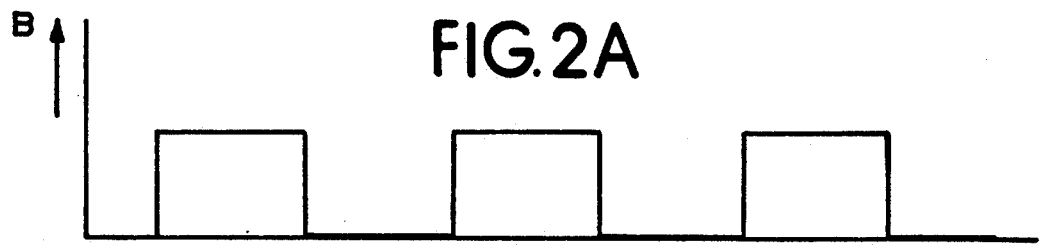
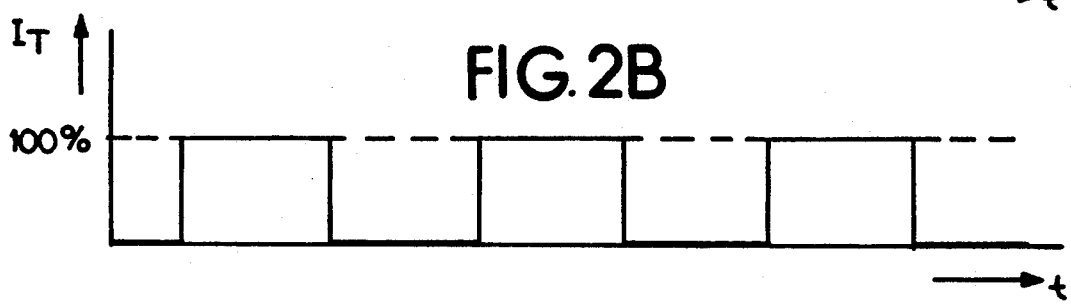
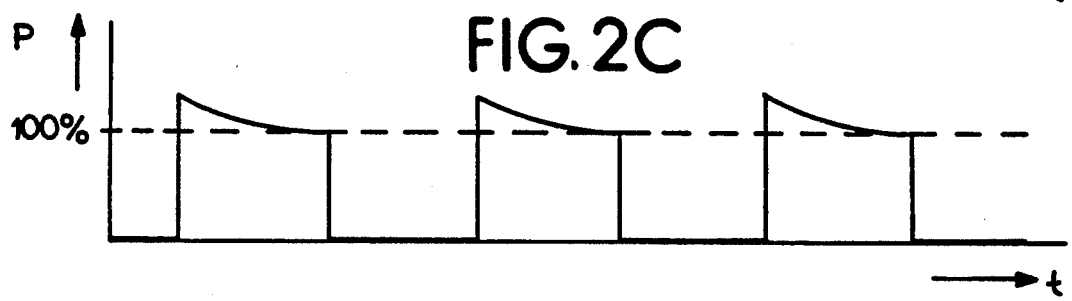
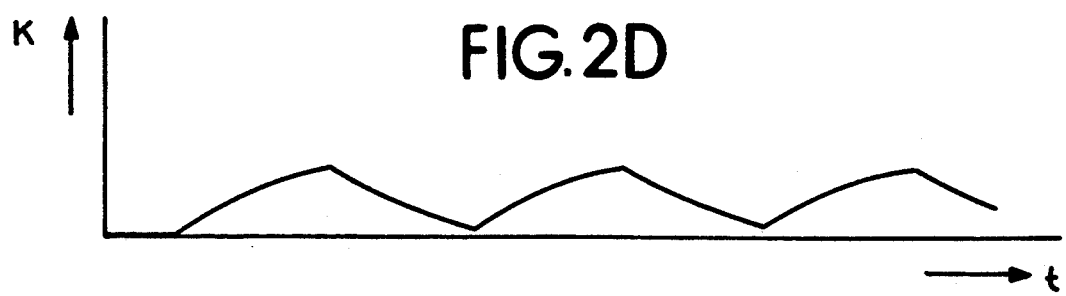
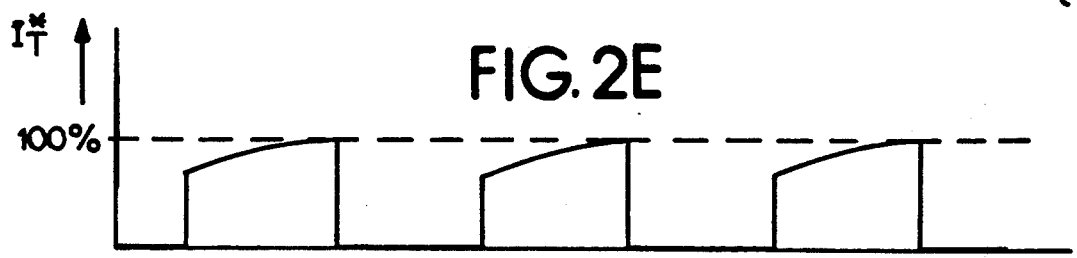
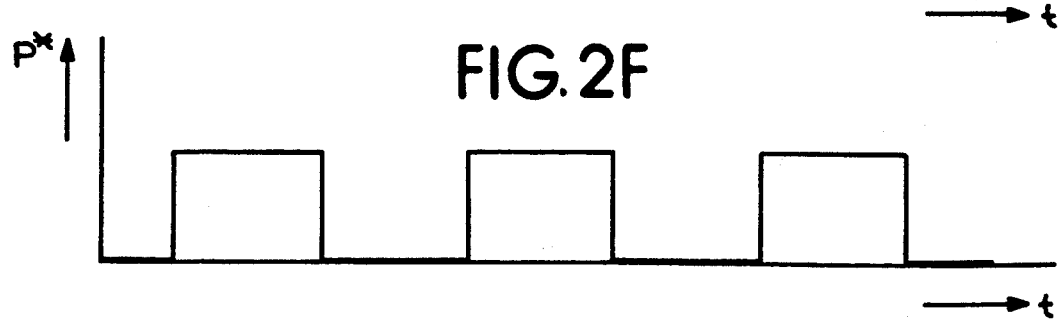

METHOD AND CIRCUIT ARRANGEMENT FOR CORRECTING THE LIGHT POWER OUTPUT OF A LASER DIODE

BACKGROUND OF THE INVENTION

The invention is directed to those fields of technology wherein laser diodes are utilized for generating laser beams, for example to electronic reproduction technology, and is directed to a method and to a circuit arrangement for correcting the light power output of a laser diode.

Laser printers and laser recorders are employed in electronic reproduction technology for recording, whereby the laser beam is being increasingly generated by laser diodes.

The light power output of such a laser diode is controlled by a driver current that is modulated by an image signal that contains the information to be recorded. The light output by the laser diode is shaped with optical means to form a light beam that is guided across the recording medium point-by-point and line-by-line with a deflection system (polygonal mirror).

For recording line information, the laser diode works in switched mode in that the light output by the laser diode is turned on and off by the driver current modulated by the image signal. In order to achieve a high recording quality, the laser diode must switch quickly and the light level must be as constant as possible in the on-time intervals. The switching behavior of the laser diode can be improved by impressing an additional Townsend current for setting a favorable operating point. Based on its very nature, the laser diode does not satisfy the demand for a constant light level in the on-time intervals, since the light power that is output is temperature-dependent, namely such that it decreases with increasing operating temperature.

During continuous operation, the gradual temperature rise in the substrate of the laser diode and the drop in light power caused as a result thereof can be compensated by controlling the housing temperature. In switched modes, however, a laser diode still has a dynamic temperature effect whose cause is the temperature change of the laser transition in the chip dependent on the modulation of the laser diode or, respectively, on the image signal. As a result thereof, the light power that is output is additionally dependent on the modulation or, respectively, on the image signal.

Even when the housing temperature is kept constant by the control, there continues to be a temperature difference between substrate and laser transition that leads to a temperature compensation process within the laser diode. This internal temperature compensation process deteriorates the switching behavior of the laser diode in such a way that the light power that is output at the turn-on time rises above the nominal level and only gradually reaches the nominal level within the on-time interval. As a consequence of this chronological curve of the light power, a disturbing lag effect which considerably influences the recording quality arises when recording an image information on the recording medium.

Various measures for correcting the light power output of a laser diode are already known.

For example, it has already been proposed to respectively measure the light power output by the laser diode within the time interval required for recording a line and to regulate the light power via the driver current dependent on the measured result.

GB-B-21 01 841 likewise also discloses that the light power that is output be measured with a photodiode (monitor diodes) integrated in the laser diode within or outside the time interval required for recording a line, to calculate correction values from the respectively measured light power, to intermediately store the correction values line-by-line in sample-and-hold circuits, and to regulate the light power via the driver current dependent on the stored correction values.

EP-A-0 141 191 further discloses that the Townsend current also be regulated in addition to the driver current in order to achieve a constant light power.

The known measures for correcting the light power output on the basis of regulation have the disadvantage that stability problems arise due to the control loops, and the switching speed of the laser diodes is reduced. Given the known measures, moreover, only one measured value is acquired in each recording line and is utilized for regulating the light power. Since the temperature changes of the laser transition and the changes in light power caused as a result thereof are dependent on the alternating frequency of the image signal and an extremely great number of changes of the image signal occur during a recording line, the changes in light power within the recording lines cannot be corrected with the precision required for a good recording quality.

US-A-4,149,071 discloses a circuit arrangement charged by a modulation signal for driving a laser diode having a compensation circuit with which disturbing changes of the light power output by the laser diode due to the dependency of the light power on the internal temperature of the laser diode are compensated, so that the output light power is proportional to the modulation signal.

The compensation circuit is essentially composed of a linear low-pass filter that approximately electrically simulates the chronological temperature curve of the laser diode dependent on the modulation signal. The output signal of the low-pass filter is then employed for correcting the driver current for the laser diode, this driver current defining the light power that is output.

Since the characteristic of a laser diode changes with the operating point, such a linear correction of the light power output by a laser diode is often insufficient when great precision is required.

SUMMARY OF THE INVENTION

It is therefore an object of the invention to specify a method and a circuit arrangement for correcting the light power output of a laser diode by which the precision with which the compensation of the temperature-dependent changes in light power occurs is enhanced.

According to the method of the invention for directing light power of a laser diode, a modulation signal modulates a driver current which charges the laser diode. The driver current defines the light power output by the laser diode. A chronological temperature curve of the laser diode is approximately electrically simulated by a linear low-pass filter dependent on the modulation signal. A correction signal output from the low-pass filter is employed for correcting the driver current in order to compensate the dependency of the output light power on the internal temperature of the laser diode. For enhancing the compensation precision, a non-linear re-correction function is calculated wherein the light power P of the laser diode dependent on the temperature T and on the driver current $I_T$ is identified as the function $P=f_1(T,I_T)$. The inverse function $I_T=f_2(T,P)$ is acquired from this identified function P as a re-correction function. The correction signal of the low-pass filter is re-corrected according to the acquired re-correction function. The re-correction signal is then employed as a correction for the driver current $I_T$.

As a result of the non-linear re-correction of the output signal of the low-pass filter, the size of the correction signal for the driver current is modified dependent on the operating point of the laser diode, as a result whereof a high compensation precision is advantageously achieved. As a result thereof, a high recording precision can be achieved given employment of the method of the invention in laser printers and laser recorders. At the same time, the disturbing lag effect is avoided without deteriorating the switching speed, a good overall reproduction quality being thus achieved overall.

The invention shall be set forth below with reference to FIGS. 1 through 6.

BRIEF DESCRIPTION OF THE DRAWINGS

FIG. 1 is a schematic circuit arrangement for the drive of a laser diode and FIG. 1a is a linear low-pass filter;

FIG. 2a-2f shows time diagrams;

FIG. 3 is another exemplary of a circuit arrangement;

DESCRIPTION OF THE PREFERRED EMBODIMENTS

Figure 4:
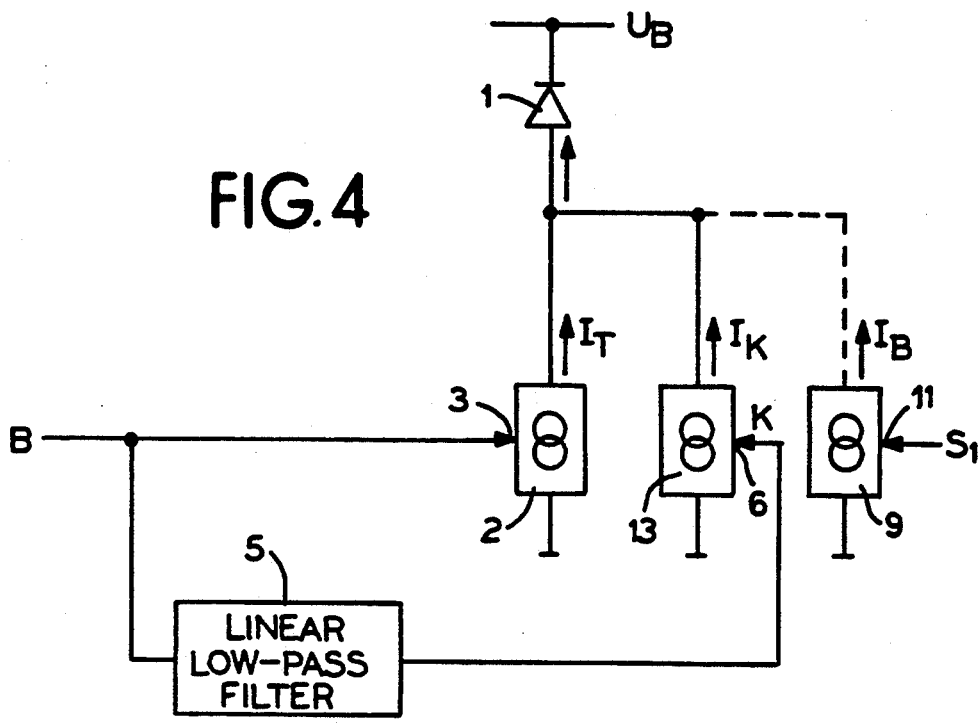
FIG. 4 is a version of the circuit arrangement.

FIG. 1 shows a schematic exemplary embodiment of a circuit arrangement for the drive of a laser diode 1 in a modulation mode.

A constant current source 2 generates a driver current $I_{T^*}$ for the laser diode 1 The constant current source 2 is connected to the anode of the laser diode 1 whose cathode is connected to the operating voltage $U_8$. An analog image signal B that is modulated with a video information to be recorded controls the driver current $I_{T^*}$ for the laser diode 1 as a modulation signal via a modulation input 3 of the constant current source 2 and, thus, controls the light power output by the laser diode 1.

In switched mode, a special instance of the modulation mode, the image signal B has two levels and the driver current $I_T$ or, respectively, the light power is switched on and off by the image signal B.

In diagrams a), b) and c), FIG. 2 shows the chronological curves of the image signal B (diagram a), of the driver current $I_T$ (diagram b) and shows the light power P (diagram c) output by the laser diode 1 for the switched mode of the laser diode 1 as a result of the temperature compensation process at the laser transition of the laser diode 1 set forth in the introduction to the specification without the measures of the invention. Diagram c) shows that the light power P that is output respectively swings above the nominal power level (100%) at the turn-on time and only gradually reaches the nominal power level during the respective on-time interval, as a result whereof the disturbing lag effect that has likewise already been mentioned in the introduction to the specification arises on the recording medium.

In order to improve the temperature behavior of the laser diode 1 and in order to compensate the disturbing lag effect, the circuit arrangement inventively comprises a linear low-pass filter 5 charged by the image signal B that simulates the chronological, thermal behavior of the laser transition in the laser diode 1 dependent on the image signal B The linear low-pass filter 5 generates a correction signal K that corresponds to the chronological change of the temperature in the laser transition dependent on the chronological curve of the image signal B.

As control signal for the driver current $I_T$, the correction signal K is forwarded to a control input 6 of the constant current source 2 The correction signal K corrects the driver current $I_T$ in switched mode in such a way that this is initially reduced in every turn-on interval and is then gradually boosted to the nominal level, as a result whereof the thermally conditioned peak of the light power output by the laser diode 1 in every turn-on interval is compensated and a constant power level is achieved FIG. 2 shows the result of the inventive correction of the light power P output by the laser diode 1 in diagrams d), e) and f).

Diagram d) shows the chronological curve of the correction signal K, and the diagram e) shows the chronological curve of the driver current $I_T$ corrected by the correction signal K. The chronological curve of the corrected light power P* is shown in diagram f).

Returning to FIG. 1. The linear low-pass filter 5 can be electrically simulated, for example, by a RC element or, respectively, by a combination of RC elements In the simplest form, which is shown in FIG. 1a, the linear low-pass filter 5 is composed of three RC elements 7, whose interconnected inputs form the input of the linear low-pass filter 5, whereas the outputs of the RC elements 7 are conducted to the inputs of an adder 8 whose output represents the output of the linear low-pass filter 5.

In the approximation of the thermal behavior of the laser diode 1 by a linear low-pass filter, the RC elements can be calculated in a simple way from the skip response of the laser diode 1.

First, the laser diode 1 is driven in continuous mode with a constant driver current $I_T$, whereby the temperature T rises and the light power P that is output drops. The light power P that is output is measured at various temperatures T and the function $P=f_1(T)$ is defined.

Subsequently, the laser diode 1 is turned on by a pulse of the image signal B and the chronological curve of the light power P that is output within the on-time interval is calculated as the function $P=f_2(t)$ (FIG. 2; diagram c). The desired function $T=f(t)$ for the thermal behavior of the laser transition $f_2(t)$. R and C of the RC elements 7 are then calculated from this function with known numerical approximation methods. For example, the calculation of R and C can be implemented at a PC with the assistance of the program "ASYSTANT" of the Keithley Company (polynominal approximation).

It is known to improve the switching behavior of a laser diode by impressing a Townsend current (bias) The operating point of the laser diode is set with the bias for the purpose of a faster switching such that it lies somewhat below the current threshold at which the laser effect begins. For generating the bias $I_B$, an additional constant current source 9 (only indicated with broken lines) is provided in the circuit arrangement of FIG. 1, this being capable of being added in as needed. The amplitude of the bias $I_B$ can be set with a control signal S' at a control input 11 of the constant current source 9.

Although, as mentioned, the employment of a bias improves the switching behavior of the laser diode, it has the disadvantage that the light power that is output does not drop to 0 when the laser diode is switched off due to the operating points set by the bias. Given sensitive recording material, this leads to an undesired pre-exposure or, respectively, to the exposure of a fundamental fog, this being felt in an especially disturbing way given potential subsequent exposures of the recording material.

In order to avoid a pre-exposure or, respectively, the exposure of a gray fog, it was occasionally necessary in traditional circuit arrangements to undertake a shift in the operating point by shutting the bias off. In this case, a great boost of the image signal was necessary in order to switch the laser diode from the on into the off condition and vice versa. The temperature in the laser transition additionally rose due to the high image signal boost and greater, disturbing changes in the light power that was output were the consequence.

This disadvantage of traditional circuit arrangements is advantageously avoided in the subject matter of the application in that the additional changes in the light power that are output when the bias current is disconnected are likewise compensated.

FIG. 3 shows a development of the circuit arrangement shown in FIG. 1. The circuit arrangement of FIG. 3 differs from that of FIG. 1 on the basis of a variable function generator 12 that is connected in series with the linear low-pass filter 5. The correction signal K generated in the linear low-pass filter 5 can be advantageously re-corrected with the function generator 12 in case the function found by way of approximation must be more exactly matched to the actual temperature behavior of the laser transition for the purpose of an enhanced compensation precision. For example, this is the case when the light power output by the laser diode 1 does not linearly change with the temperature. The characteristic of the function generator 12 is calculated in that an inverse function $I_T = f(t, b = \text{constant})$ of the measured function $P = f(t, I_T)$ is calculated.

FIG. 4 shows a version of the circuit arrangement of FIG. 1 wherein a further constant current source 13 is present. The constant current source 13 generates a correction current $I_K$ dependent on the correction signal K that is supplied to the constant current source 13 via a control input 6'. The corrected driver current $I^*_T$ in this case is composed of the driver current $I_T$ generated in the constant current source 3, of the correction current $I_K$ of the constant current source 13 and, potentially, of the bias $I_B$ generated in the constant current source 9. This circuit arrangement is particularly suited for automatic control due to the separate generation of the currents.

Figure 5:
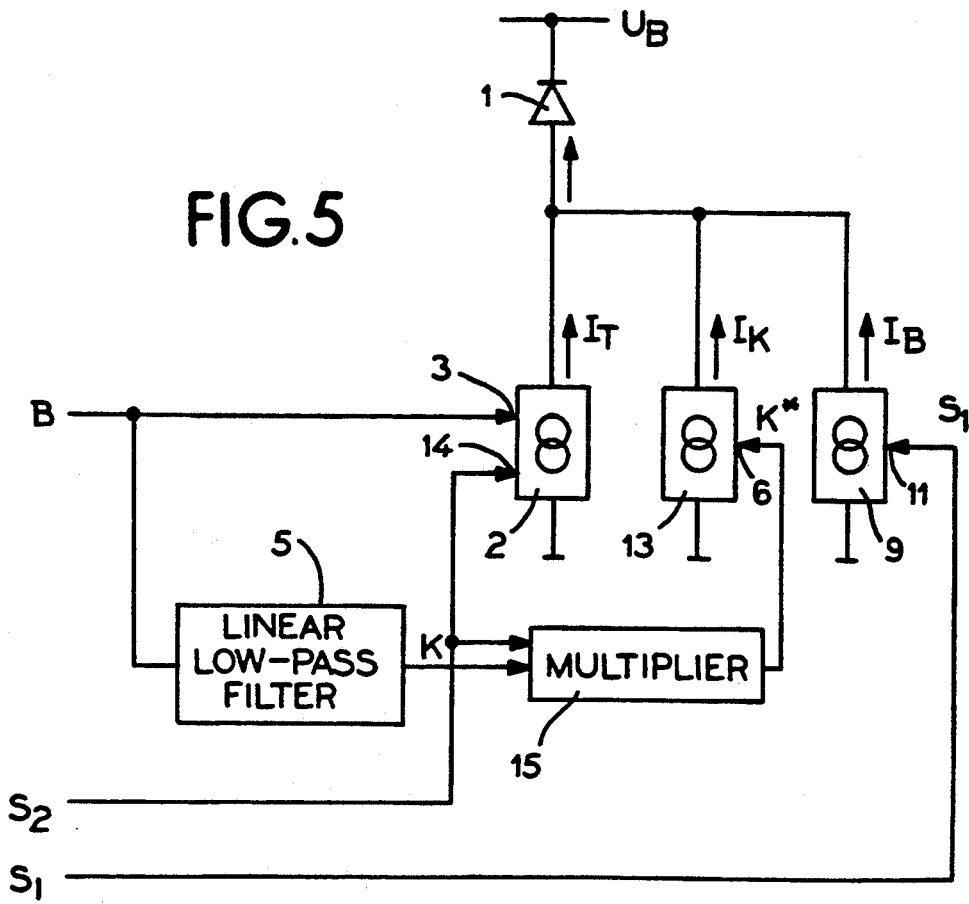
FIG. 5 is an exemplary embodiment of a circuit arrangement for automatic control.

FIG. 5 shows an exemplary embodiment of a circuit arrangement for the automatic control of the light power output by the laser diode 1. Given, for example, the simultaneous recording of recording materials having different sensitivities, this circuit arrangement serves the purpose of automatically adapting the light power of the laser diode 1 to the different sensitivities.

The analog control signal $S_1$ that is forwarded to the control input 11 of the constant current source 9 controls the amplitude of the bias $I_B$. The analog control signal $S_2$ at the control input 14 of the constant current source 2 changes the amplitude of the driver current $I_T$ and, thus, the light power output by the laser diode 1.

For automatically adapting the correction signal $I_K$ to the amplitude change of the driver current $I_T$, the correction signal K generated by the linear low-pass filter 5 is multiplied by the control signal $S_2$ in a multiplier 15. The correction signal K* acquired in this way is then forwarded to the control input 6' of the constant current source 13.

Figure 6:
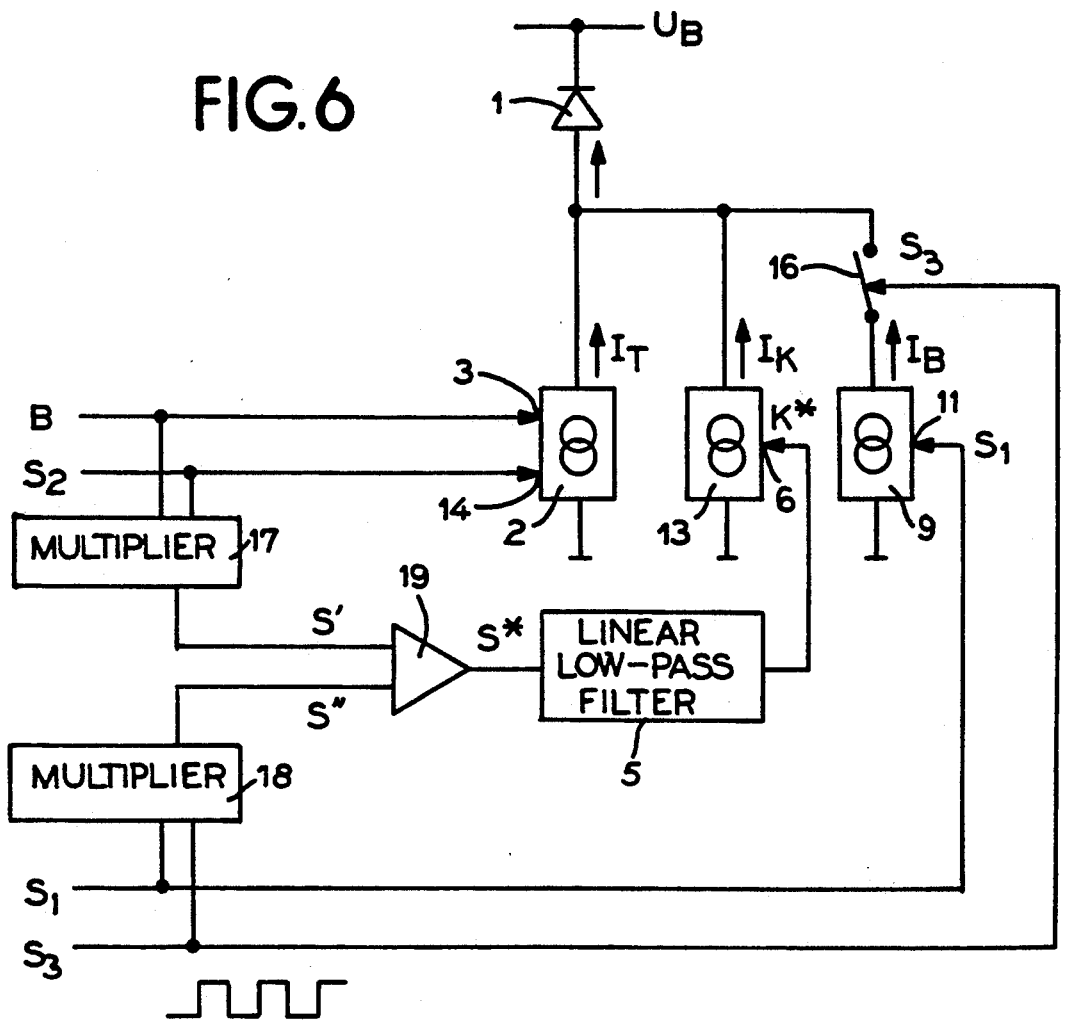
FIG. 6 is another exemplary embodiment of a circuit arrangement for automatic control.

FIG. 6 shows another exemplary embodiment of a circuit arrangement for automatically controlling the light power output by the laser diode 1, whereby the correction current $I_K$ is matched to the amplitude change of the driver current $I_T$, to the amplitude change of the bias $I_B$ and to the on/off condition of the constant current source 9.

The analog control signal $S_2$ at the control input 14 of the constant current source 2 changes the amplitude of the driver current $I_T$. The analog control signal $S_1$ at the control input 11 of the constant current source 9 influences the amplitude of the bias $I_B$. The two-level control signal $S_3$ opens and closes a switch 16 via which the constant current source 9 is connected to the laser diode 1. The image signal B and the analog control signal $S_2$ are multiplied with one another in a multiplier 17 in order to obtain a combination signal S'. Likewise, a combination signal S'' is acquired from the control signal $S_3$ and from the control signal $S_1$ in a further multiplier 18. A modified control signal S* that is forwarded to the input of the linear low-pass filter 5 instead of the image signal B in the circuit arrangements of FIGS. 1 through 5 is then formed from the two combination signals S' and S'' with an adder 19.

The function generator 12 additionally shown in FIG. 3 can, of course, also be introduced into the circuits of FIGS. 4 through 6. As shown, the linear low-pass filter 5 can be constructed in analog fashion of RC elements. It can also be fashioned as a memory wherein the calculated temperature function of the laser transition is stored.

It also lies within the framework of the invention to not generate the driver current $I_T$, the bias $I_B$ and the current $I_K$ in constant current sources but with voltage sources.

Although various manor changes and modifications might be proposed by those skilled in the art, it will be understood that we wish to include within the claims of the patent warranted herein all such changes and modifications as reasonably come within our contribution to the art.

We claim:

1. A method for correcting light power P of a laser diode comprising the steps of:

modulating a driver current $I_T$ which drives the laser diode with a modulation signal, said driver current defining the light power P output by the laser diode;

approximately electrically simulating a chronological temperature curve of the laser diode by a linear low-pass filter which outputs a correction signal dependent on said modulation signal;

to enhance compensation precision, calculating a non-linear re-correction function by identifying a function $P = f_1(T, I_T)$ of the light power P of the laser diode dependent on temperature T of the laser diode and on the driver current $I_T$;

acquiring from this identified function an inverse function $I_T = f_2(T,P)$ as said re-correction function;

re-correcting said correction signal output by the low-pass filter according to the acquired re-correction function; and employing the re-corrected output signal for correcting the driver current $I_T$.

2. A method according to claim 1 including the steps of for identifying a transfer function of the linear low-pass filter, inputting to the laser diode a skip pulse of said driver current $I_T$, measuring a curve of the output light power P in a pulse interval dependent on time t as a first function $P = f_1(t)$;

operating the laser diode in a continuous mode and measuring the output light power P in view of housing temperature T of the laser diode as a second function $P = f_2(T)$; and calculating the transfer function $T = f(t)$ of the low-pass filter from the first and second functions.

3. A method according to claim 1 including the step of generating the driver current $I_T$ for the laser diode and a constant current source controlled by said correction signal.

4. A method according to claim 1 including the steps of generating the driver current $I_T$ in a first constant current source;

generating a correction current $I_K$ in a second constant current source controlled by said re-correction signal; and correcting said driver current $I_T$ by said correction current $I_K$.

5. A method according to claim 1 including the step of impressing on said laser diode an additional bias current $I_B$ for setting an operating point thereof.

6. A method according to claim 1 including the steps of:

generating said driver current $I_T$ in a first constant current sources controlled by a control signal;

generating a correction current $I_K$ in a second constant current source controlled by a modified correction signal;

acquiring a bias current $I_B$ for said laser diode in a third constant current source controllable by at least one further control signal; and forming said modified correction signal for said second constant current source from said correction signal output by the low-pass filter and at least one of said control signal and said further control signal for automatic control of temperature compensation.

7. A method for correcting light power of a laser diode, comprising the steps of:

providing a constant current source to provide driver current for driving the laser diode;

modulating the constant current source with a modulating signal at a modulating input thereof;

with a low-pass filter having said modulating signal at its input, creating a correction signal at an output of the low-pass filter which simulates a chronological thermal behavior of laser transition dependent on the modulating signal;

enhancing the correction signal to create a re-correction signal which more exactly matches non-linear thermal behavior of said laser transition; and feeding said re-correction signal to said constant current source to correct the light power of the laser diode.

8. A circuit arrangement for correcting an output light power P of a laser diode, comprising:

generator means connected to said laser diode for generating a driver current $I_T$ which defines said output light power P;

means for modulating said driver current $I_T$ dependent on a modulation signal;

a low-pass filter means for receovomg said modulation signal for approximately simulating a chronological curve of an internal temperature of said laser diode dependent on said modulation signal, and for providing a correction signal for correction of said driver current $I_T$ in order to compensate a dependency of said output light power P on said internal temperature of said laser diode; and a function generator means for enhancing compensation precision by providing a re-correction function which re-corrects said correction signal of said low-pass filter and outputs a re-correction signal according to said re-correction function, an input of said function generator means being connected to an output of said low-pass filter means, an output thereof being connected to a control input of said generator means for converting said driver current $I_T$ into a corrected driver current $I_T^*$ for the laser diode.

9. A circuit arrangement according to claim 8 wherein said generator means comprises a constant current source.

10. A circuit arrangement for correcting light power P of a laser diode, comprising:

first generator means connected to said laser diode for generating a driver current $I_T$ for said laser diode which defines said output light power P;

means for modulating said driver current $I_T$ dependent on a modulation signal;

a low-pass filter means input with said modulation signal for approximately simulating a chronological curve of an internal temperature of said laser diode dependent on said modulation signal; said low-pass filter means creating a cprrectopm signal for correction of said driver current $I_T$ to compensate a dependency of said output light power P on said internal temperature of said laser diode;

second generator means connected to said laser diode for generating a correction current $I_K$ for said driver current $I_T$; and function generator means for providing a re-correction signal based on a re-correction function for enhancing compensation precision, an input of said function generator means being connected to receive said correction signal output from said low-pass filter means and an output of said function generator means being connected to a control input of said second generator means in order to modify said correction current $I_K$ with said correction signal.

11. A circuit arrangement according to claim 8 wherein said first generator means and second generator means are each current sources.

12. A circuit arrangement for correcting light power P of a laser diode, comprising:

first generator means connected to said laser diode for generating a driver current $I_T$ for said laser diode for defining said output light power P;

means for modulating said driver current $I_T$ dependent on a modulation signal;

a low-pass filter means which receives said modulation signal for approximately simulating a chronological curve of an internal temperature of said laser diode dependent on said modulation signal, said low-pass filter means providing a correction signal for correction of said driver current $I_t$ for compensating a dependency of said output light power P on said internal temperature of said laser diode;

a second generator means connected to said laser diode for generating a correction current $I_K$ for said driver current $I_T$;

a third generator means for generating a bias current $I_B$ for said laser diode, an output of said third generator means being connected to said laser diode and a control input thereof being connected with a first control signal;

switch means between said laser diode and said output of said third generator means for being actuated by a third control signal;

a first multiplier means connected to receive a second control signal and said modulation signal, said second control signal being connected to a control input of said first generator means;

a second multiplier means connected to receive said first control signal and said third control signal;

adder means whose inputs are connected to outputs of said first and second multiplier means and whose output is connected to an input of said low-pass filter means; and a function generator means for providing a re-correction signal based on a recorrection function for correcting the correction signal of said low-pass filter means for enhancing compensation precision, an input of said function generator means being connected to said correction signal from said low-pass filter means and an output of said function generator means being connected to a control input of said second generator means.

13. A circuit arrangement according to claim 12 wherein said first generator means, second generator means, and third generator means each comprise constant current sources.

* * * * *